United States Patent
Kim et al.

(10) Patent No.: US 10,025,178 B2
(45) Date of Patent: Jul. 17, 2018

(54) PATTERNING DEVICE

(71) Applicant: RESEARCH & BUSINESS FOUNDATION SUNGKYUNKWAN UNIVERSITY, Suwon-si (KR)

(72) Inventors: Tae Il Kim, Seoul (KR); Kwang-Su Kim, Seoul (KR); Jong-Uk Kim, Sangju-si (KR); Piljin Yoo, Seoul (KR); Hyowon Tak, Busan (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 177 days.

(21) Appl. No.: 15/079,833

(22) Filed: Mar. 24, 2016

(65) Prior Publication Data

US 2016/0282715 A1    Sep. 29, 2016

(30) Foreign Application Priority Data

Mar. 24, 2015  (KR) .................. 10-2015-0040820
Mar. 23, 2016  (KR) .................. 10-2016-0034865

(51) Int. Cl.
| | |
|---|---|
| *B29C 35/02* | (2006.01) |
| *G03F 7/00* | (2006.01) |
| *B29C 59/04* | (2006.01) |
| *B29C 59/02* | (2006.01) |
| *B29C 35/08* | (2006.01) |

(52) U.S. Cl.
CPC ............ *G03F 7/0002* (2013.01); *B29C 35/02* (2013.01); *B29C 59/046* (2013.01); *B29C 59/026* (2013.01); *B29C 2035/0211* (2013.01); *B29C 2035/0827* (2013.01)

(58) Field of Classification Search
CPC .. B29C 59/046; B29C 59/04; B29C 2059/023
USPC ........................................... 425/470
See application file for complete search history.

(56) References Cited

U.S. PATENT DOCUMENTS

| | | | |
|---|---|---|---|
| 4,054,701 A * | 10/1977 | Hahn | B29C 59/022 |
| | | | 264/284 |
| 7,819,652 B2 | 10/2010 | Lee et al. | |
| 7,927,089 B2 | 4/2011 | Seki et al. | |
| (Continued) | | | |

FOREIGN PATENT DOCUMENTS

EP      2112868      * 10/2009

OTHER PUBLICATIONS

Barry Jones, "Fluoropolymers for Coating Applications," JCT CoatingsTech, Sep. 2008.*

(Continued)

*Primary Examiner* — Matthew Daniels
*Assistant Examiner* — Hana Page
(74) *Attorney, Agent, or Firm* — NSIP Law

(57) ABSTRACT

Disclosed is a patterning device. The patterning device may include a substrate; a patterned layer disposed on the substrate and including a first pattern formed on a surface thereof; a heat generating layer disposed on the patterned layer, including a second pattern (corresponding to the first pattern) formed on a surface thereof, and generating heat when electric power is supplied; and a first electrode and a second electrode disposed on the heat generating layer, spaced apart from each other, and electrically connected to the heat generating layer.

12 Claims, 7 Drawing Sheets

(56) References Cited

U.S. PATENT DOCUMENTS

| | | | | |
|---|---|---|---|---|
| 2009/0140468 A1* | 6/2009 | Kawaguchi | ......... | B29C 33/3857 264/447 |
| 2011/0056059 A1* | 3/2011 | Shimizu | ................... | B41J 2/161 29/25.35 |
| 2014/0145106 A1* | 5/2014 | Hayashi | .............. | C04B 35/4682 252/62.9 PZ |
| 2015/0181650 A1* | 6/2015 | Kim | ................... | H05B 3/0014 219/552 |
| 2017/0082957 A1* | 3/2017 | Nakajima | ............ | G03G 15/206 |

OTHER PUBLICATIONS

Zhoukun He et al. "Fabrication of a transparent superamphiphobic coating with improved stability," Soft Matter, Jun. 2011.*

English Translation of WO2016108656; Dae Hwan Lee et al.*

* cited by examiner

[FIG. 1A]
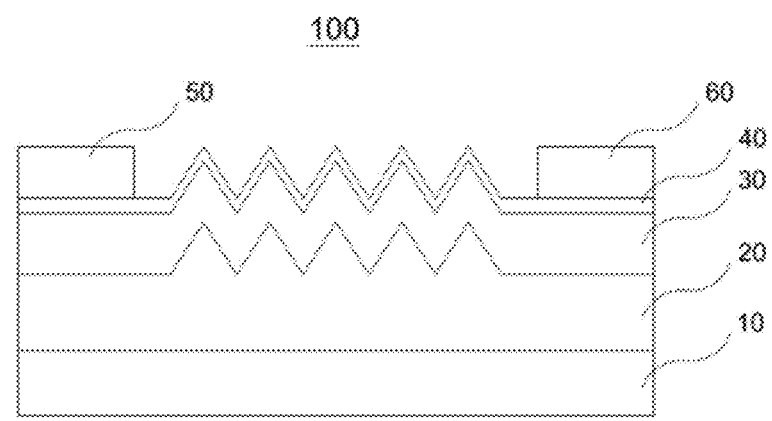
[FIG. 1B]
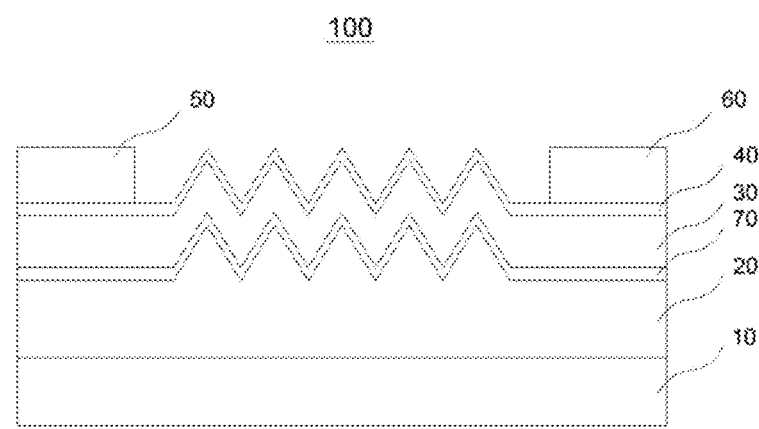

[FIG. 2]
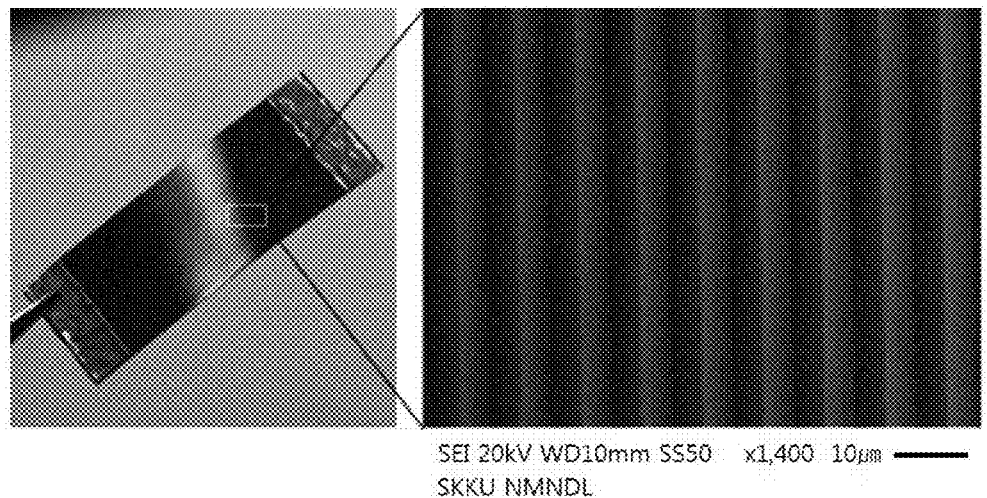
[FIG. 3A]
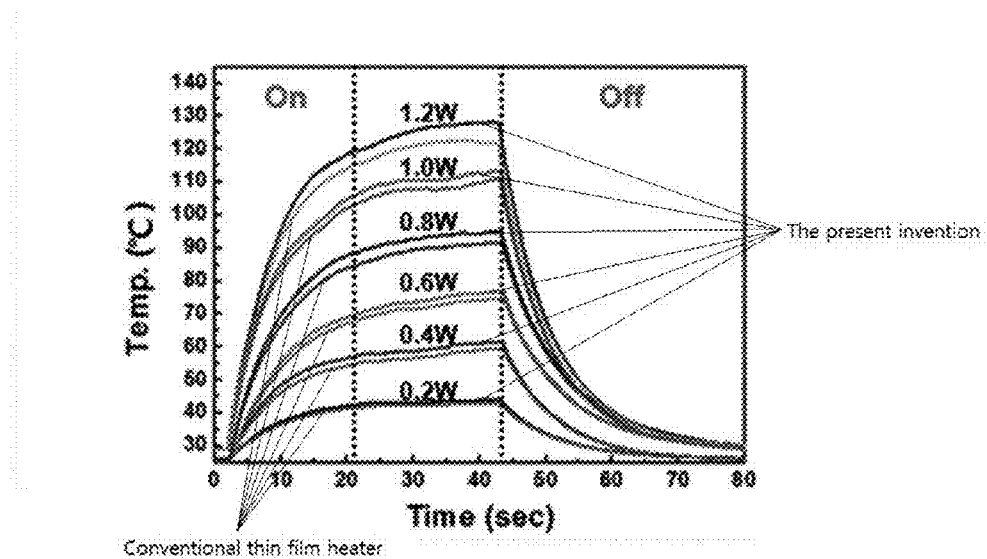

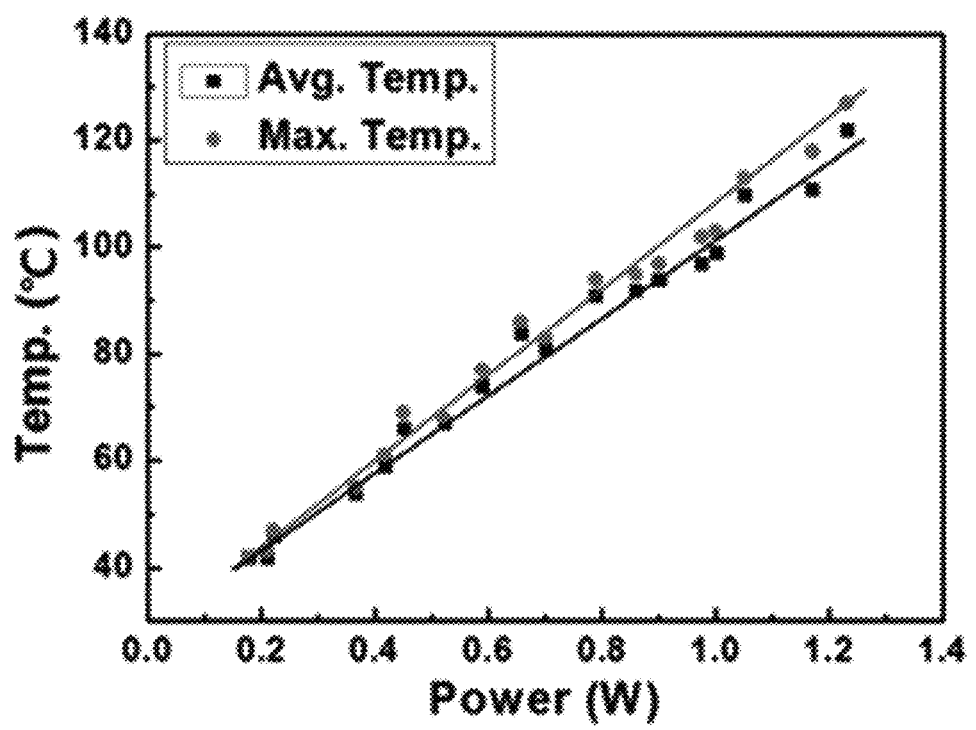
[FIG. 3B]

[FIG. 4]
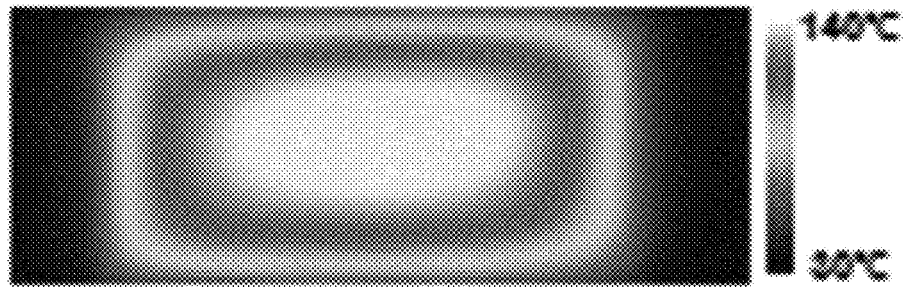
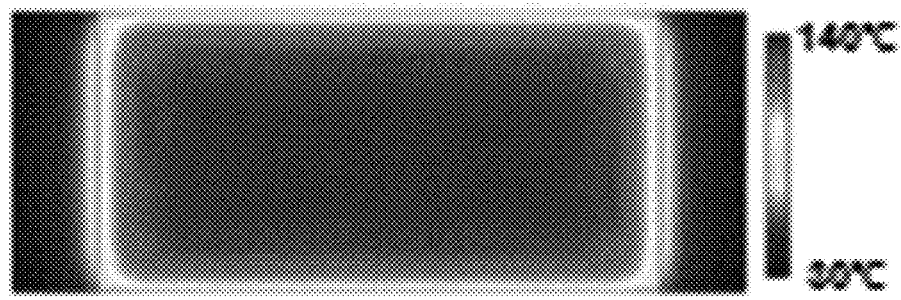

[FIG. 5]
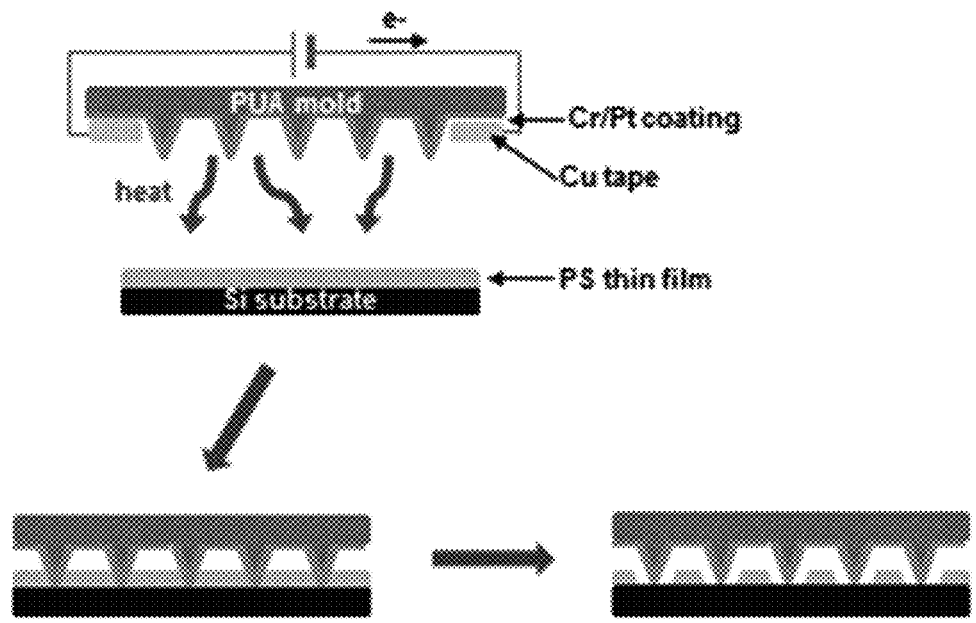
[FIG. 6]
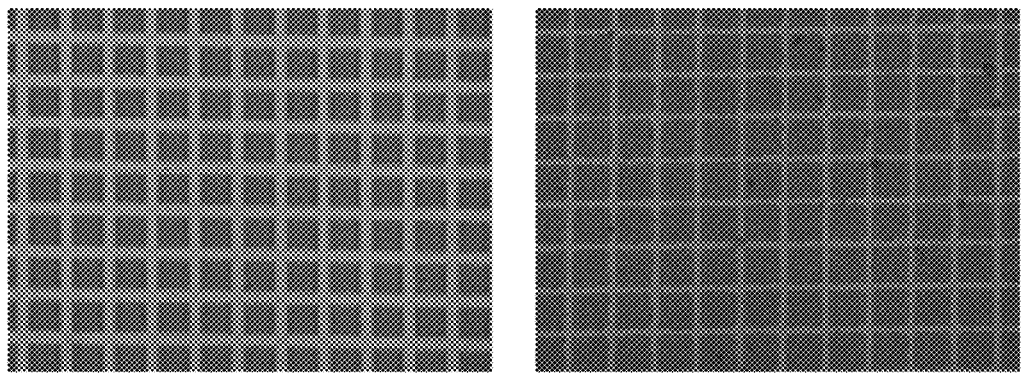

[FIG. 7A]
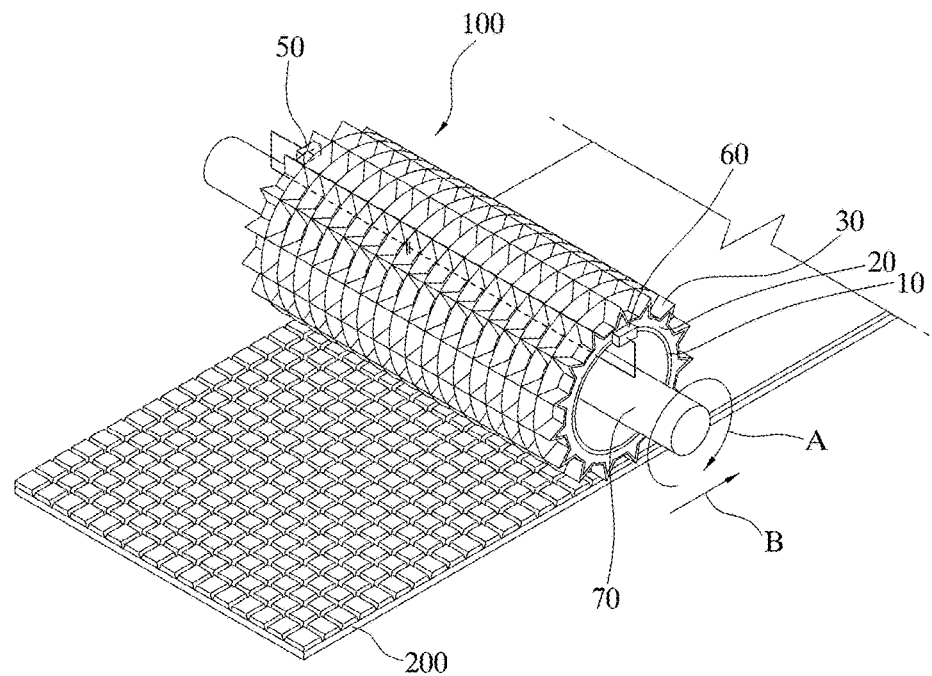

[FIG. 7B]
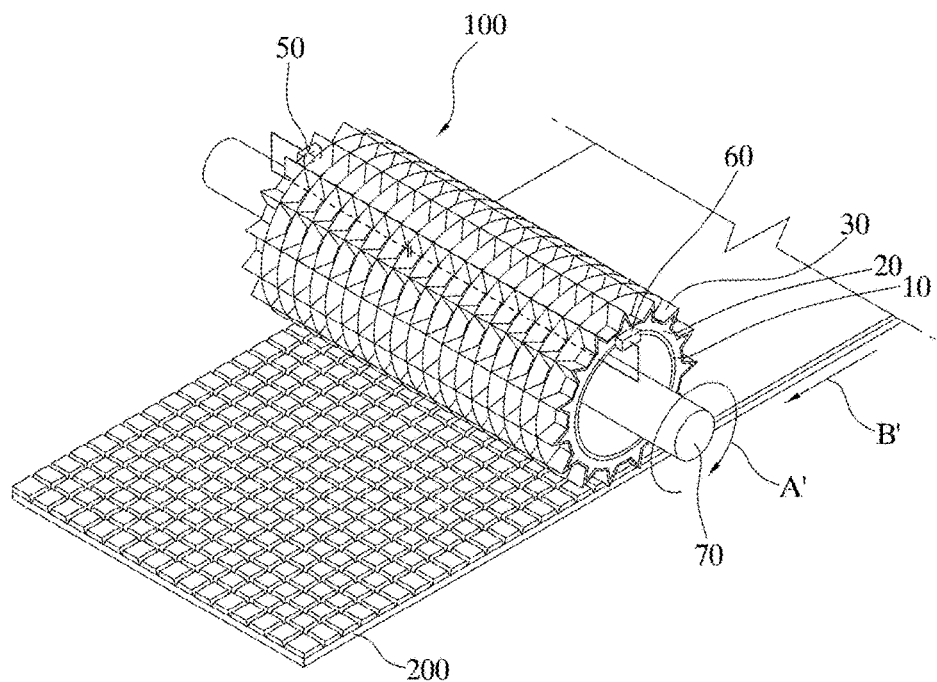

PATTERNING DEVICE

CROSS-REFERENCE TO RELATED APPLICATIONS

This application claims the benefit of Korean Patent Application No. 10-2015-0040820, filed on Mar. 24, 2015, and Korean Patent Application No. 10-2016-0034865, filed Mar. 23, 2016 the entire disclosures of which are incorporated herein by reference for all purposes.

BACKGROUND

1. Field of the Invention

The present invention relates to a patterning device, and more particularly, to a patterning device that can generate heat and perform large-area patterning.

2. Discussion of Related Art

Photolithography normally used to form a micro/nano-sized pattern has a shortcoming in terms of resolution, because the widths of patterns that can be formed are limited to about 100 nm due to the interference of light. Also, a lithography method having the same or a lower resolution has problems of high costs, complicated processing, and somewhat limits the usability of flexible substrates or organic materials. To solve such problems, various unconventional lithography techniques such as nanoimprint lithography (NIL), capillary force lithography (CFL) using a capillary force, and selective dewetting using a dewetting phenomenon of a polymer film were proposed.

Unconventional lithography is a technique of making a replica using a mold and normally refers to a technique that uses a mold made of a polymeric material such as polydimethylsiloxane (PDMS), polyurethane acrylate (PUA) to replicate, on a polymer thin film, a pattern engraved on the mold. For example, the NIL method replicating the pattern at a temperature equal to or greater than the glass transition temperature (Tg) of the polymer thin film is a representative unconventional lithography technique.

However, since the NIL cannot apply pressure uniformly on an entire region of the polymer thin film, patterning over a large area is difficult to achieve. Also, since the entire region is heated to increase the temperature to the Tg of the polymer of interest, the substrate may be damaged by temperature and pressure or the polymer thin film may be deformed by heat, and thus, the process is difficult to apply to a large area.

To solve those problems related to a large area, thermal nanoimprint lithography using a halogen lamp to thermally enable a step-and-repeat process was proposed, but it has a problem of large (electric) power consumption, and a metal screen and a heat sinker are always required. In addition to such a thermal method, step-and-flash imprint lithography (SFIL) using ultraviolet rays (UV) was proposed. However, since quartz is used as the mold, it is difficult to engrave a pattern on the mold, any air bubbles generated inside the quartz are difficult to remove, and demolding is difficult due to the rigidity of the mold itself.

SUMMARY OF THE INVENTION

The technical problem that the present invention intends to solve is to provide a patterning device capable of adjusting the temperature of heat with supplied power, controlling the width of a pattern, and patterning using the heat generated from itself.

To solve the technical problem, a patterning device of an exemplary embodiment of the present invention may include a substrate; a patterned layer disposed on the substrate and including a first pattern formed on a surface thereof; a heat generating layer disposed on the patterned layer, including a second pattern (corresponding to the first pattern) formed on a surface thereof, and generating heat when power is supplied; and a first electrode and a second electrode disposed on the heat generating layer, spaced apart from each other, and electrically connected to the heat generating layer.

In one exemplary embodiment, the first electrode and the second electrode may be respectively disposed on end portions of the heat generating layer, and a third pattern corresponding to the second pattern may be formed between the first electrode and the second electrode.

The patterning device of an exemplary embodiment of the present invention may further include, between the first electrode and the second electrode, a protective layer disposed on the heat generating layer and including the third pattern corresponding to the second pattern.

In one exemplary embodiment, an adhesive layer disposed between the patterned layer and the heat generating layer may be further included.

In one exemplary embodiment, the patterned layer may be made of a material having a rigid-flexible property, and the patterned layer may consist of a material that does not deform even at temperatures up to 150° C.

In one exemplary embodiment, the patterned layer may include one or more selected from the group consisting of polyurethane acrylate (PUA), polydimethylsiloxane (PDMS), perfluoropolyether (PFPE), polyurethane (PU), polytetrafluoroethylene (PTFE) (i.e. TEFLON), and NORLAND OPTICAL ADHESIVE (NOA), a clear, colorless, liquid photopolymer that will cure when exposed to ultraviolet light. That is, NOA is a UV-curable polymer.

In one exemplary embodiment, the substrate may include one or more selected from the group consisting of a polycarbonate (PC), polyethersulfone (PES), a polyimide (PI), a polynorbornene, polyethylene naphthalate (PEN), AryLite™, and polyethylene terephthalate (PET).

In one exemplary embodiment, the heat generating layer may include one or more selected from the group consisting of platinum, molybdenum, tungsten, tantalum, gold, silver, graphene, carbon nanotubes, silver nanowires, copper nanowires, indium tin oxide (ITO), and fluorinated tin oxide (FTO), and the thickness of the heat generating layer may range from 5 to 200 nm.

In one exemplary embodiment, the adhesive layer may include chromium (Cr) or titanium (Ti), and the thickness of the adhesive layer may range from 1 to 100 nm.

In one exemplary embodiment, the protective layer may include a self-assembled monolayer (SAM), and the SAM may consist of one or more selected from the group consisting of 3-(2,2,3,3,4,4,5,5-octafluoropentyloxy)propyltriethoxysilane (OPF), trimethoxy(propyl)silane (TMS), 1-hexadecanethiol, 1H,1H,2H,2H-perfluoro-1-decanol, and 1H,1H,2H,2H-perfluorooctyltriethoxysilane (PFTS).

In another aspect of the present invention, the patterning device may be a cylinder-type. The first electrode and the second electrode may be electrically connected to each other through the interior of the cylinder. A cylinder-type substrate may be configured to be rotatable about a shaft that passes through both ends of the cylinder and is perpendicular to the cross-section of the cylinder.

According to the present invention as described above, heat can be generated from the patterning device itself, and thus, a pattern can be formed without the use of an oven or a hot plate.

Also, by varying the amount of generated heat that depends on the applied power, patterning suitable for the properties of a patterning target material (polymer thin film, etc.) can be provided and the patterning can be applied to various polymer thin films.

In addition, since the time required for the temperature of the generated heat to saturate is shorter, patterning can be done in a shorter time compared to when a conventional thin film heater is used. Moreover, uniform patterning is possible, because the temperature of the generated heat is uniformly distributed.

According to the present invention, hierarchical patterning is possible by varying applied pressure, and the width of a pattern formed can be controlled by varying the duration of contacting the polymer thin film. Also, according to the present invention, by repeating a process (e.g. the step-and-repeat process) of contacting a polymer thin film and separating from the same, it is possible to pattern over a polymer thin film having a large area, and, conversely, to pattern exclusively over a specific region.

The cylinder-type patterning device of the present invention can perform continuous and indefinite patterning in a longitudinal direction by a rolling imprint patterning method and enable mass production.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1A and FIG. 1B are diagrams for describing a patterning device of an exemplary embodiment of the present invention;

FIG. 2 is a photograph for describing a patterning device of an exemplary embodiment of the present invention;

FIG. 3A is a graph showing the temperature change of a patterning device of an exemplary embodiment of the present invention over time, which is measured according to power applied;

FIG. 3B is a graph showing the temperature change of a patterning device of an exemplary embodiment of the present invention according to power applied;

FIG. 4 is a photograph showing an actual measurement of the heat generated from a patterning device of an exemplary embodiment of the present invention and a photograph showing a simulated measurement of the heat generated from a patterning device of an exemplary embodiment of the present invention;

FIG. 5 is a diagram for describing a patterning process using a patterning device of an exemplary embodiment of the present invention;

FIG. 6 is a set of photographs of grid patterns formed using a patterning device of an exemplary embodiment of the present invention; and FIGS. 7A and 7B show an exemplary cylinder-type patterning device.

DETAILED DESCRIPTION OF EXEMPLARY EMBODIMENTS

The present invention may have various exemplary embodiments and various modifications, and thus, only particular exemplary embodiments will be exemplified with reference to drawings and presented in a detailed description section. However, there is no intention to limit the present invention to the particular exemplary embodiments, and it should be understood that the scope of the present invention encompasses all modifications, equivalents or alterations made within the spirit and technical scope of the present invention.

Hereinafter, a specific exemplary embodiment according to the present invention will be described in detail with reference to accompanying drawings. In the drawings, the same elements are denoted by the same reference numerals.

FIG. 1A and FIG. 1B are diagrams for describing patterning devices of an exemplary embodiment of the present invention, and FIG. 2 is a photograph for describing a patterning device of an exemplary embodiment of the present invention. In FIG. 2, an image on the left is a photograph showing a patterning device of an exemplary embodiment of the present invention, and an image on the right in FIG. 2 is a photograph of a magnified surface of a patterning device of an exemplary embodiment of the present invention.

Referring to FIGS. 1A to 2, a patterning device 100 of an exemplary embodiment of the present invention may include a substrate 10, a patterned layer 20, a heat generating layer 30, a protective layer 40, a first electrode 50, and a second electrode 60.

The substrate 10 is a component for supporting the patterned layer 20 that will be described below and, for example, may include one or more selected from the group consisting of a polycarbonate (PC), polyethersulfone (PES), a polyimide (PI), a polynorbornene, polyethylene naphthalate (PEN), ARYLITE™, and polyethylene terephthalate (PET). ARYLITE™ is a transparent polyarylate film having a Tg of 325° C., negligible retardation (<10 nm for a 100 μm-thick film), and excellent clarity (90.4% transmission (400-700 nm range)).

The patterned layer 20 may be disposed on the substrate 10 and have a first pattern formed thereon. The shape of the first pattern may be suitably modified in consideration of a pattern to be formed on the patterning target, and, for example, may have a sawtooth shape as shown in FIGS. 1A and 2B, but is not limited thereto.

For example, it is preferable that the patterned layer 20 consists of a material having a rigid-flexible property. The patterned layer 20 may consist of a material that does not deform even at temperatures up to about 150° C. to prevent the patterned layer 20 from being damaged by the heat generated from the heat generating layer 30, which will be described below.

For example, the patterned layer 20 may include one or more selected from the group consisting of polyurethane acrylate (PUA), polydimethylsiloxane (PDMS), perfluoropolyether (PFPE), polyurethane (PU), polytetrafluoroethylene (PTFE) (i.e. TEFLON), and NORLAND OPTICAL ADHESIVE (NOA), a clear, colorless, liquid photopolymer that will cure when exposed to ultraviolet light. That is, NOA is a UV-curable polymer.

The heat generating layer 30 may be disposed on the patterned layer 20 and have a second pattern corresponding to the first pattern of the patterned layer 20. In addition, the heat generating layer 30 may generate heat when power is supplied thereto. The heat generating layer 30 may be disposed on the patterned layer 20 by a deposition process. For example, the heat generating layer 30 may include one or more selected from the group consisting of platinum, molybdenum, tungsten, tantalum, gold, silver, graphene, carbon nanotubes, silver nanowires, copper nanowires, indium tin oxide (ITO), and fluorinated tin oxide (FTO).

The heat generating layer 30 may have a thickness range of about 5 to 200 nm. When the thickness of the heat generating layer 30 is less than about 5 nm, since the resistance of the heat generating layer 30 is excessively high, much energy needs to be supplied to the heat generating layer 30 so that the heat generating layer 30 can generate heat with a desired temperature, and the supply of much energy (e.g. supply of high voltage) may cause damage to the heat generating layer 30 itself. In contrast, when the thickness of the heat generating layer 30 exceeds about 200 nm, the heat generating layer 30 may generate heat with a desired temperature even when low voltage is supplied. However, since it takes some time for the temperature of the heat generated by the heat generating layer 30 to increase to the desired temperature, the imprint process time may increase and a long time is required for the deposition of the heat generating layer 30, which leads to an increase in the required time for the production of the patterning device 100.

The first electrode 50 and the second electrode 60 may be disposed on the heat generating layer 30, spaced apart from each other. For example, the first electrode 50 and the second electrode 60 may be disposed on both end portions of the heat generating layer 30, wherein the end portions do not include the second pattern that is formed on a surface of the heat generating layer 30. Alternatively, as shown in FIGS. 1A and 1B, the first electrode 50 and the second electrode 60 may be disposed on the protective layer 40 that will be described below.

For example, the first electrode 50 and the second electrode 60 may be electrically connected with the heat generating layer 30, and, in another example, they may be electrically connected to the heat generating layer 30 by being disposed on both sides of the heat generating layer 30. When the heat generating layer 30 is conductive, voltage may be applied to both sides of the heat generating layer 30 so that the heat generating layer 30 generates heat. For example, a copper (Cu) tape containing Cu may be used as the first electrode 50 and the second electrode 60, but it may be variously substituted by another material, as long as it exhibits conductivity.

Each of the first electrode 50 and the second electrode 60 may be electrically connected with a power supply device (e.g. battery, etc.). When the voltage is supplied between the first electrode 50 and the second electrode 60, electric current flows in the heat generating layer 30, resulting in the generation of heat from the heat generating layer 30.

The protective layer 40 may be disposed on the heat generating layer 30 and include a third pattern (corresponding to the second pattern of the heat generating layer 30) formed between the first electrode 50 and the second electrode 60, which enables the third pattern to come into contact with a surface of an object that is a patterning target. In addition, the protective layer 40 may be disposed entirely on the heat generating layer 30 for the ease of production.

The protective layer 40 is a component for preventing the object, e.g. a polymer thin film, that is the patterning target from adhering to a surface of the heat generating layer 30 due to the melting of a surface of the polymer thin film by heat from the heat generating layer 30. The protective layer 40 may include a self-assembled monolayer (SAM), and, for example, the SAM may include one or more selected from the group consisting of 3-(2,2,3,3,4,4,5,5-octafluoropentyloxy)propyltriethoxysilane (OPF), trimethoxy(propyl)silane (TMS), 1-hexadecanethiol, 1H,1H,2H,2H-perfluoro-1-decanol, and 1H,1H,2H,2H-perfluorooctyltriethoxysilane (PFTS).

Since the protective layer 40 prevents the polymer thin film from adhering to the surface of the heat generating layer 30 and, also, the patterned layer 20 exhibits a rigid-flexible property, the patterning device 100 of an exemplary embodiment of the present invention can be separated easily from the polymer thin film.

When heat is generated from the heat generating layer 30 due to a difference in the coefficient of thermal expansion between the heat generating layer 30 and the patterned layer 20, the heat generating layer 30 may be separated from the patterned layer 20. As a preventive measure, the patterning device 100 of an exemplary embodiment of the present invention may further include an adhesive layer 70 disposed between the patterned layer 20 and the heat generating layer 30. For example, the adhesive layer 70 preferably consists of a material that does not deform even at temperatures up to about 150° C. to prevent the adhesive layer 70 from being damaged by the heat generated from the heat generating layer 30 and to maintain an adhesive performance. For example, chromium (Cr) or titanium (Ti) may be used in the adhesive layer 70, and the adhesive layer 70 may be disposed on the patterned layer 20 by using a dual target sputtering system to deposit Cr on the patterned layer 20.

For example, the adhesive layer 70 preferably has a thickness range of about 1 to 100 nm. When the thickness of the adhesive layer 70 is less than 1 nm, the adhesive layer 70 is affected by the heat generated from the heat generating layer 30, causing the adhesive performance to degrade such that the adhesive layer 70 cannot serve to prevent the separation between the heat generating layer 30 and the patterned layer 20. Also, when the thickness of the adhesive layer 70 exceeds 100 nm, it may take a long time to dispose the adhesive layer 70 between the patterned layer 20 and the heat generating layer 30, leading to an increase in the time required for the production of patterning device 100 and to a reduced efficiency in transferring the heat generated in the heat generating layer 30 to the object that is the patterning target.

With the use of the patterning device 100 of an exemplary embodiment of the present invention, it is possible to attain a pattern having a hierarchical structure. For example, patterns having a hierarchical structure can be formed on a polystyrene (PS) thin film by placing the patterning device 100 of an exemplary embodiment of the present invention on the PS thin film and varying the pressure applied on the patterning device 100. Also, the patterning device 100 of an exemplary embodiment of the present invention is capable of large-area patterning. For example, a desired pattern is formed on a specific region of a PS thin film having a large area by placing the patterning device 100 on the specific region of the PS thin film and then applying pressure on the patterning device 100 or generating heat from the same. Next, by placing the patterning device 100 on a region surrounding the specific region on which the pattern was formed and then forming the pattern (by using the step-and-repeat process) on the surrounding region, the desired pattern can also be formed on the PS film having a large area.

FIG. 3A is a graph showing the temperature change of a patterning device of an exemplary embodiment of the present invention over time, which is measured according to power applied.

Referring to FIG. 3A, it can be found that, when the power supplied is 0.2 W, the temperature saturation time of a conventional thin film heater and that of the patterning device 100 of an exemplary embodiment of the present invention tend to be similar to each other, and that, when the power supplied is 0.4 W or greater, the temperature saturation time of the patterning device 100 of an exemplary embodiment of the present invention increases faster than that of the conventional thin film heater. This suggests that the patterning device 100 of an exemplary embodiment of the present invention may enable patterning in a shorter time compared to the conventional thin film heater. Also, the patterning device 100 of an exemplary embodiment of the present invention can control the temperature of the generated heat with the power supplied.

FIG. 3B is a graph showing the temperature change of a patterning device of an exemplary embodiment of the present invention according to the power supplied.

Referring to FIG. 3B, it can be seen that the difference between the average temperature (Avg. Temp) and maximum temperature (Max. Temp) in response to the power supplied is not large in the patterning device 100 of an exemplary embodiment of the present invention. This may confirm that the patterning device 100 of an exemplary embodiment of the present invention can generate uniform temperature over the entire region, which means that heat may be uniformly applied over the entire region subjected to patterning. Therefore, by patterning with the patterning device 100 of an exemplary embodiment of the present invention, a problem of non-uniform patterning caused by the concentration of heat in a particular region can be solved.

FIG. 4 is a photograph showing an actual measurement of the heat generated from a patterning device of an exemplary embodiment of the present invention and a photograph showing a simulated measurement of the heat generated from a patterning device of an exemplary embodiment of the present invention.

Referring to FIG. 4, it can be found that heat having a temperature of about 140° C. is generated at a central part of the patterning device 100 of an exemplary embodiment of the present invention and that the temperature of the heat decreases with increasing distance from the central part. Such results are almost consistent with the simulated results generated using a simulation program (COMSOL Multiphysics 7.3v software). Such results show that the patterning device 100 of an exemplary embodiment of the present invention may be manufactured in a way so that the user can generate a desired level of heat.

FIG. 5 is a diagram for describing a patterning process using a patterning device of an exemplary embodiment of the present invention.

Referring to FIG. 5, when the patterning device 100 of an exemplary embodiment of the present invention is brought into contact with a PS film with a thickness of about 100 nm or less coating a prepared glass substrate, with the subsequent generation of heat, the patterning of a PS film over time can be observed. As more time elapses, an increase in the width of the pattern on the PS film can be observed, which confirms that the controlling of the width of the pattern is possible with the use of the patterning device 100 of an exemplary embodiment of the present invention. In addition, an action of bringing of the patterning device 100 of an exemplary embodiment of the present invention into contact with a PS film and separating the patterning device from the PS film can also form a pattern on the PS film and also copy a pattern by a nanoimprint lithography method. Therefore, with the use of the patterning device 100 of an exemplary embodiment of the present invention, a desired pattern can be formed by various methods.

FIG. 6 is a set of photographs of grid patterns formed using a patterning device of an exemplary embodiment of the present invention.

Referring to FIG. 6, by placing the patterning device 100 of an exemplary embodiment of the present invention having a sawtooth-shaped pattern on a polymer thin film (e.g. on a specific region of the PS thin film), generating heat in the patterning device 100, and applying pressure to the same, a first pattern having a shape of lines spaced apart by a fixed distance is formed on the specific region of the PS thin film. With this method, the first pattern having a shape of lines spaced apart by a fixed distance is formed on the entire region of the PS thin film.

Next, a second pattern perpendicular to the first pattern is formed on a specific region on the PS thin film by placing the patterning device 100 perpendicularly to the line-shaped first pattern, generating heat on the patterning device 100, and applying pressure to the same. With this method, the second pattern having a shape of lines spaced apart by a fixed distance can be formed on the entire region of the PS thin film to produce a grid pattern on the entire region of the PS thin film.

Next, by depositing a metal layer on the grid pattern and subsequently removing the polymer thin film using an organic solvent (e.g. acetone and toluene), a metal layer having a grid pattern can be prepared. The grid-patterned metal layer prepared as thus may be used as an electrode.

FIGS. 7A-7B show an exemplary cylinder-type patterning device. The patterning device 100 of the present invention may be a cylinder-type. The cylinder-type patterning device is configured to be rotatable about a shaft 70 passing through both ends of the cylinder and perpendicular to the cross-section of the cylinder, such that it can rotate while being in contact with a surface of the object to be patterned (hereinafter, referred to as a patterning target 200), and form a pattern (hereinafter, this method is referred to as rolling imprint patterning).

As shown in FIG. 7A, the patterning target is fixed and the cylinder-type patterning device 100 can form a pattern over a large area of a target surface by rotating, while being in contact with the surface of the patterning target 200 and moving horizontally (direction B).

As shown in FIG. 7B, according to the rolling imprint patterning method, the patterning target 200 moves horizontally (direction B') and the cylinder-type patterning device rotates in place (direction A') so that a large-area pattern can be formed on the patterning target 200.

The electrical connection between the first electrode 50 and the second electrode 60 is made through the interior of the cylinder constituting the cylinder-type patterning device so that a wire connecting the electrodes is not disposed between a patterned surface of cylinder-type patterning device and a patterning target surface to be patterned during rolling imprint patterning. In this way, large-area patterning by the rolling imprint patterning method can be guaranteed.

While the exemplary embodiments of the present invention have been described above, these are only examples. It will be understood by those skilled in the art that various modifications and equivalent other embodiments may be made. Therefore, the true technical scope of the present invention will be defined by the appended claims.

| Description of Reference Numerals | |
|---|---|
| 100: PATTERNING DEVICE | |
| 10: SUBSTRATE | 20: PATTERNED LAYER |
| 30: HEAT GENERATING LAYER | 40: PROTECTIVE LAYER |
| 50: FIRST ELECTRODE | 60: SECOND ELECTRODE |
| 70: ADHESIVE LAYER | |
| 70: SHAFT | |
| 200: PATTERNING TARGET | |

What is claimed is:

1. A patterning device, comprising:
a substrate;
a patterned layer disposed on the substrate and including a first pattern formed on a surface thereof;
a heat generating layer disposed on the patterned layer, including a second pattern (corresponding to the first pattern) formed on a surface thereof, and generating heat when supplied with electric power;
a first electrode and a second electrode disposed on the heat generating layer, spaced apart from each other, wherein each of the first electrode and the second electrode is electrically connected to the heat generating layer;
between the first electrode and the second electrode, a protective layer covering the heat generating layer and including a third pattern corresponding to the second pattern; and
an adhesive layer which is chromium (Cr) or titanium (Ti) disposed between the patterned layer and the heat generating layer configured to prevent the separation between the patterned layer and the heat generating layer when heat is generated from the heat generating layer due to a difference in the coefficient of the thermal expansion between the heat generating layer and the patterned layer.

2. The patterning device of claim 1, wherein the first electrode and the second electrode are respectively disposed on end portions of the heat generating layer.

3. The patterning device of claim 1, wherein the patterned layer consists of a material that does not deform at temperatures up to 150° C.

4. The patterning device of claim 3, wherein the patterned layer includes one or more selected from the group consisting of polyurethane acrylate (PUA), polydimethylsiloxane (PDMS), perfluoropolyether (PFPE), polyurethane (PU), polytetrafluoroethylene, and a clear, colorless, liquid photopolymer that cures when exposed to ultraviolet light.

5. The patterning device of claim 1, wherein the substrate includes one or more selected from the group consisting of a polycarbonate (PC), polyethersulfone (PES), a polyimide (PI), a polynorbornene, polyethylene naphthalate (PEN), a transparent polyarylate film, and polyethylene terephthalate (PET).

6. The patterning device of claim 1, wherein the heat generating layer includes one or more selected from the group consisting of platinum, molybdenum, tungsten, tantalum, gold, silver, graphene, carbon nanotubes, silver nanowires, copper nanowires, indium tin oxide (ITO), and fluorinated tin oxide (FTO).

7. The patterning device of claim 1, wherein the heat generating layer has a thickness ranging from 5 to 200 nm.

8. The patterning device of claim 1, wherein the adhesive layer has a thickness ranging from 1 to 100 nm.

9. The patterning device of claim 1, wherein the protective layer includes one or more selected from the group consisting of 3-(2,2,3,3,4,4,5,5-octafluoropentyloxy)propyltriethoxysilane (OPF), trimethoxy(propyl)silane (TMS), 1-hexadecanethiol, 1H,1H,2H,2H-perfluoro-1-decanol, and 1H,1H,2H,2H-perfluorooctyltriethoxysilane (PFTS).

10. The patterning device of claim 1, wherein the substrate has a shape of a cylinder.

11. The patterning device of claim 10, wherein the first electrode and the second electrode are electrically connected to each other through an interior of the cylinder.

12. The patterning device of claim 10, wherein the substrate having a shape of a cylinder is configured to be rotatable about a shaft that passes through both ends of the cylinder and is perpendicular to a cross-section of the cylinder.

\* \* \* \* \*